United States Patent [19]

Hallee et al.

[11] Patent Number: 4,527,271

[45] Date of Patent: Jul. 2, 1985

[54] PROCESS CONTROL SYSTEM WITH IMPROVED FAULT ISOLATION

[75] Inventors: Donald O. Hallee, North Easton; Harold Lake, Sharon; Kenneth L. Johansson, North Grafton; Thomas B. Graves, Norton, all of Mass.

[73] Assignee: The Foxboro Company, Foxboro, Mass.

[21] Appl. No.: 408,967

[22] Filed: Aug. 17, 1982

[51] Int. Cl.³ .......................... G06F 9/22; G06F 11/00
[52] U.S. Cl. ...................................... 371/20; 364/184; 364/186
[58] Field of Search ................... 371/15, 20; 364/184, 364/185, 186; 324/52 A, 52 AA

[56] References Cited

U.S. PATENT DOCUMENTS

| | | | |
|---|---|---|---|
| 3,997,879 | 12/1976 | Markley et al. | 364/184 X |
| 4,107,253 | 8/1978 | Borg et al. | 371/20 X |
| 4,118,792 | 10/1978 | Struger et al. | 371/20 X |
| 4,195,769 | 4/1980 | Elias et al. | 371/20 |
| 4,322,847 | 3/1982 | Dodge et al. | 371/20 |
| 4,351,023 | 9/1983 | Richer | 364/187 |

Primary Examiner—Charles E. Atkinson
Assistant Examiner—Mark Ungerman
Attorney, Agent, or Firm—Jack H. Wu; Terrence (Terry) Martin; William E. Meyer

[57] ABSTRACT

A process control system includes redundant digital controllers and a plurality of input/output (I/O) modules for interfacing with remote field sensors and actuators. Bi-directional communication between controllers and I/O modules is achieved by a parallel-wired, process I/O bus. Failures within the system, including the bus structure itself, that continually keep the bus active (i.e., in a low state) are isolated by a combination of software diagnostic routines for performing bus checkout and a unique quick disconnect feature that readily isolates the fault condition first between the I/O module nest area and the controllers, then, if necessary, to individual I/O modules. During fault isolation procedures, individual I/O modules may be disconnected from the bus while the values of field signals are simultaneously maintained to provide minimum process upset.

24 Claims, 9 Drawing Figures

PROCESS CONTROL SYSTEM WITH IMPROVED FAULT ISOLATION

FIELD OF THE INVENTION

This invention relates to process control systems and particularly to computer-based systems for providing direct digital control over industrial processes. More specifically the invention relates to such systems that include enhanced means for performing fault isolation that may be carried out expeditiously and with minimum process disruption.

BACKGROUND OF THE INVENTION

Direct digital control systems have been used in the process industries for some time now. With the increased use of digital computers to provide process management and control, there has also been an increased awareness in the area of system security and reliability. One such effort is disclosed in copending application Ser. No. 139,495 now U.S. Pat. No. 4,351,023, assigned to the same assignee as the present case. That application discloses the use of redundant digital controllers with a shared data buffer arranged to permit the transfer of data base from one controller to the other, together with means for the other controller to examine the integrity of the first controller before accepting the information being transferred.

Usually digital controllers are configured in a vertical storage assembly, commonly referred to as a rack, located in a central station (e.g., a control room). The rack includes, in addition to power supplies, provisions for housing the central processing unit (CPU) and the interface circuitry for communicating with the process field sensors and actuators. This field communication interface is typically accomplished by a series of input-/output (I/O) modules located in a connector housing area or nest in one centralized portion of the digital controller. A parallel bus structure is often used to transmit commands/data between the I/O modules and the CPU of the controller. When a parallel bus is used, a wired-conductor (e.g., a ribbon cable) forms the external bus link between the controller and the I/O nest, while a backplane in the nest extends the bus interface through appropriate connectors to the individual I/O modules within the nest.

These parallel bus structured systems increase the difficulty in isolating system failures. In particular, failed I/O modules or bus line failures that short the bus to ground are troublesome to locate because the modules and related bus interface components are in effect "or'ed" together.

One way of troubleshooting such failures is to continuously run diagnostic programs when a failure is detected and sequentially remove each module from its assigned area in the nest to see which one causes the problem to disappear. This can be a time consuming procedure because of the necessity of removing the module from its connection to the bus backplane, which in some cases involves unscrewing and disconnecting field terminations to permit physical separation of the module connector from the bus. Removal of the module from its connector housing area in this manner also would result in loss of field signal value. Additionally the possibility exists of transferring erroneous control data to the I/O modules during the connect/disconnect process outlined above.

It is apparent that a need exists to provide better fault isolation capabilities within process control systems of the type described above. This is especially so in pinpointing within a minimum time and with a minimum process upset, failures of individual I/O modules connected to a parallel I/O bus structure.

SUMMARY OF THE INVENTION

In accordance with a preferred embodiment of the present invention, a direct digital control system is disclosed having redundant digital controllers which communicate through a process I/O (PIO) bus to remotely positioned sensors and actuators located within a process field. Interface with these field devices is accomplished by a plurality of I/O modules which gather analog signals representing field measurements and transmit corresponding digitized values along the PIO bus to the controllers. Similarly, commands from the controllers to the field components are sent along the PIO bus to the I/O modules for ultimate transmission to the field. Failures within the system, including the bus structure itself, that continually keep the bus active (i.e., in a low state) are isolated by a combination of software diagnostic routines for performing bus checkout and a unique quick disconnect feature that readily isolates the fault condition first between the I/O module nest area and the controllers, then, if necessary, to individual I/O modules.

A ribbon cable forms the bus link externally of the I/O nests while a backplane is utilized for bus access within the nests themselves. The interface between the ribbon cable and the bus backplane is accomplished by a bus interface module positioned at the bus input to each individual nest. This module is a printed circuit board which extends all the bus lines from the ribbon cable to the PC board contact pads. The interface module is plugged into a cam actuated connector which provides a simple mechanical means to quickly disconnect the PIO bus from the entire array of I/O modules. If the indication of failure is not removed, the fault lies within the controller or its interface connection with the bus. Conversely, if the failure indication is removed, the fault is most likely caused by a failed I/O module affecting one or more bus lines. In accordance with one important aspect of the invention, each I/O module within the nest is connected to the bus backplane by a cam actuated connector similarly arranged as with the bus interface module to allow disengagement of individual I/O modules from the backplane from the front of the nest. As software diagnostics are continuously being run, when the module causing the failure is disconnected from the bus, the indication of failure will be removed. In this manner, the time necessary for locating a failed I/O module can be significantly reduced.

In accordance with another important aspect of the invention, the limitations of prior fault detection techniques of previous process control systems are overcome by permitting disengagement of individual I/O modules from the PIO bus while simultaneously maintaining the value of the field signals. Field power to the module is maintained through a separate connector at the front of the nest. Since the module does not have to be physically moved to break the bus backplane connection, this field connection remains unbroken. Also, the connect/disconnect procedure for I/O modules (and bus interface) outlined above is sequenced by the cam actuated connector to assure minimum disruption of the operation of the bus.

DRAWINGS

Further advantages and objects of the present invention will become apparent from the following detailed description taken in context with the following drawing figures wherein.

Figure 1:
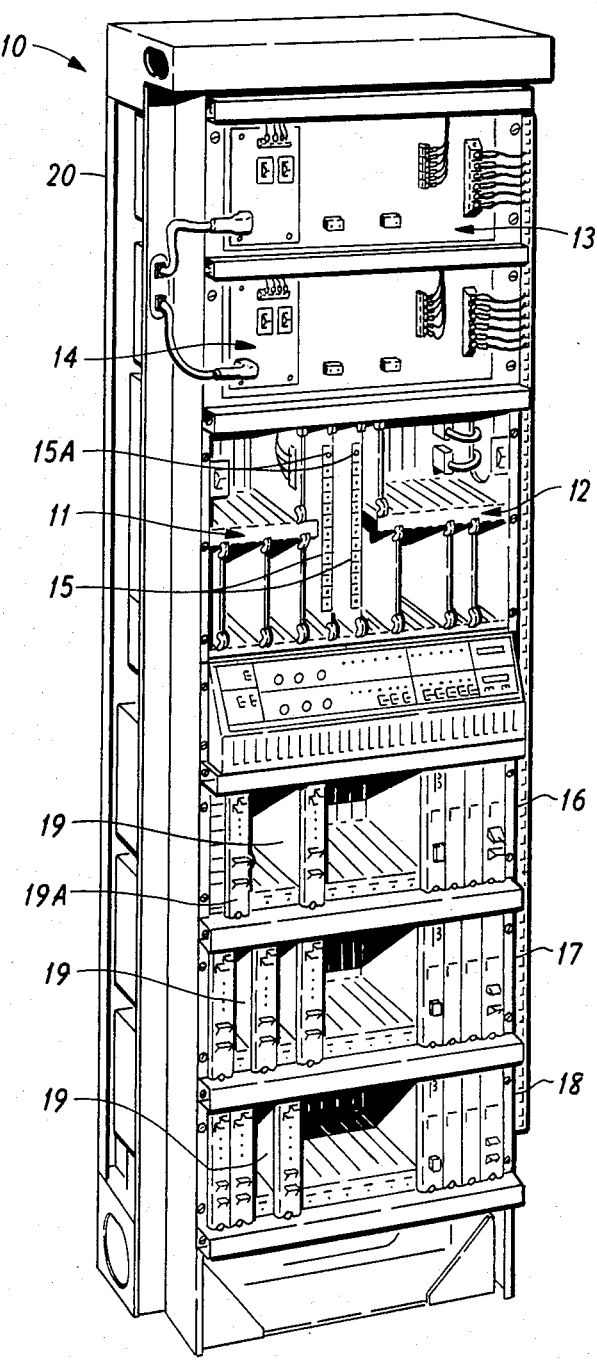
FIG. 1 is a perspective view of a process control system constructed in accordance with the present invention.
Figure 6A:
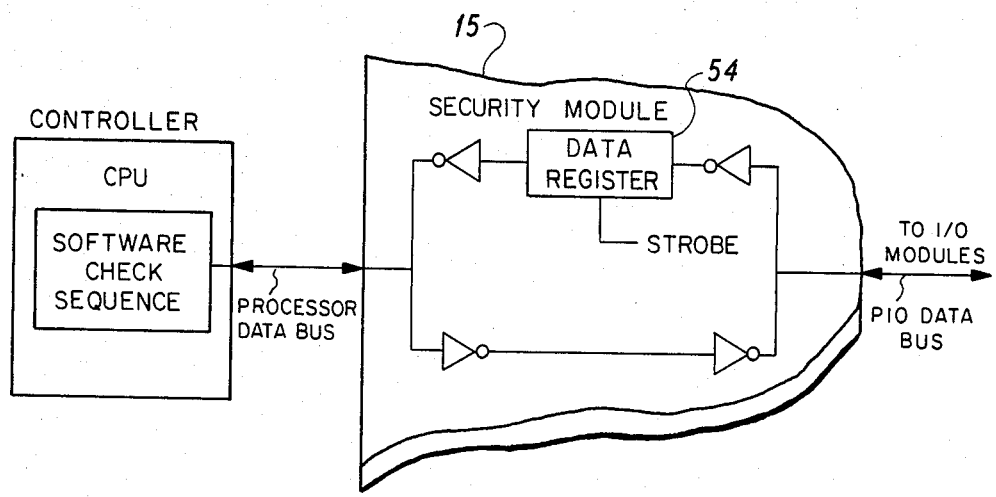
Figure 7:
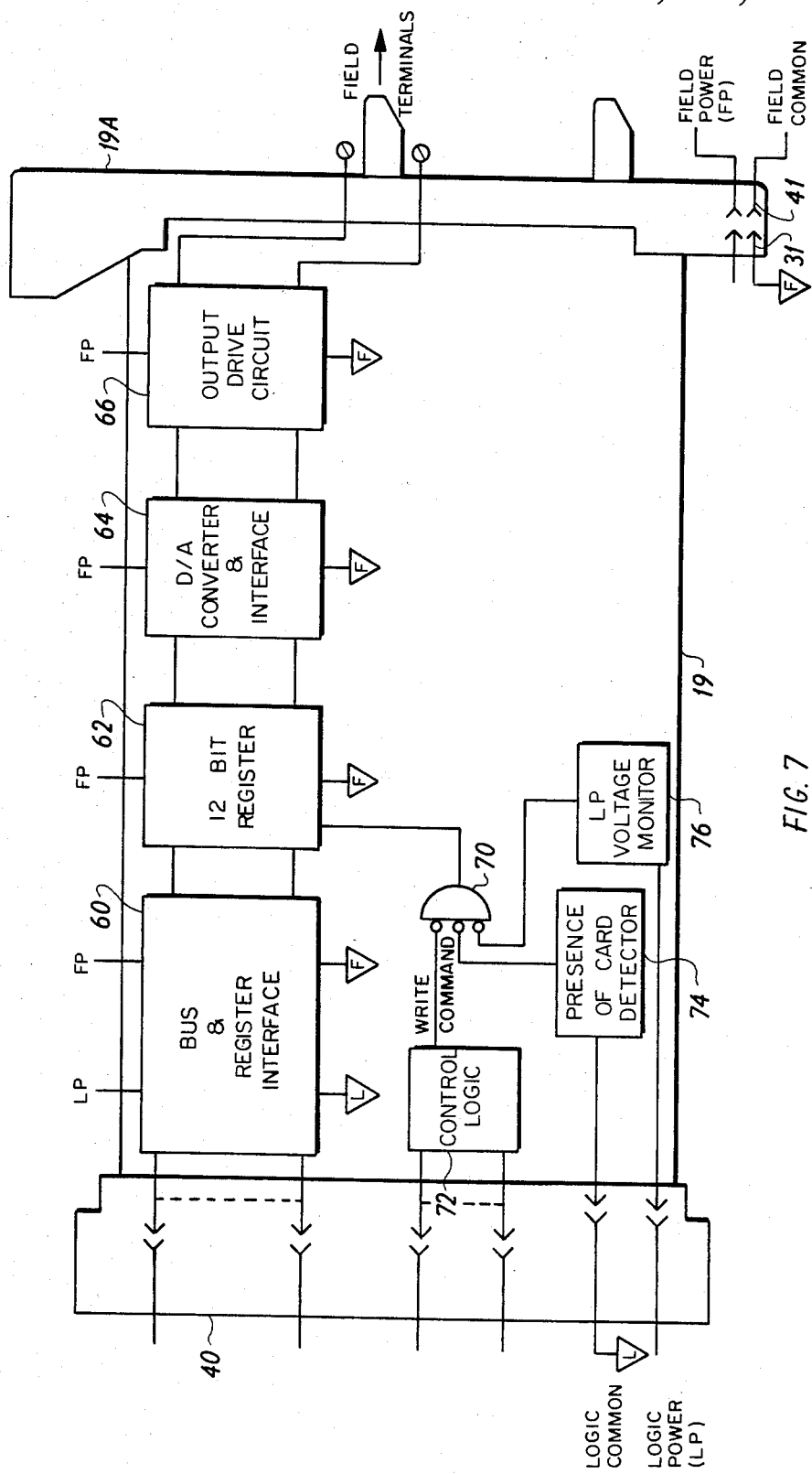

FIGS. 6A, B & C are block diagrams of various diagnostic routines implemented by the system of FIG. 1; and FIG. 7 is a block diagram, partly in pictorial, of a typical I/O module showing the connections to its output channel.

DESCRIPTION OF THE PREFERRED EMBODIMENT

FIG. 1 shows in perspective a control system 10 constructed in accordance with the present invention housed in a vertical rack 20. The system consists of three major subassemblies—two indentical digital controllers 11, 12, redundant power supply assemblies 13, 14, and three I/O module nests 16, 17 and 18. The controllers are adapted to perform the necessary calculations for performing direct digital control over a variety of industrial processes within process plants.

Figure 2:
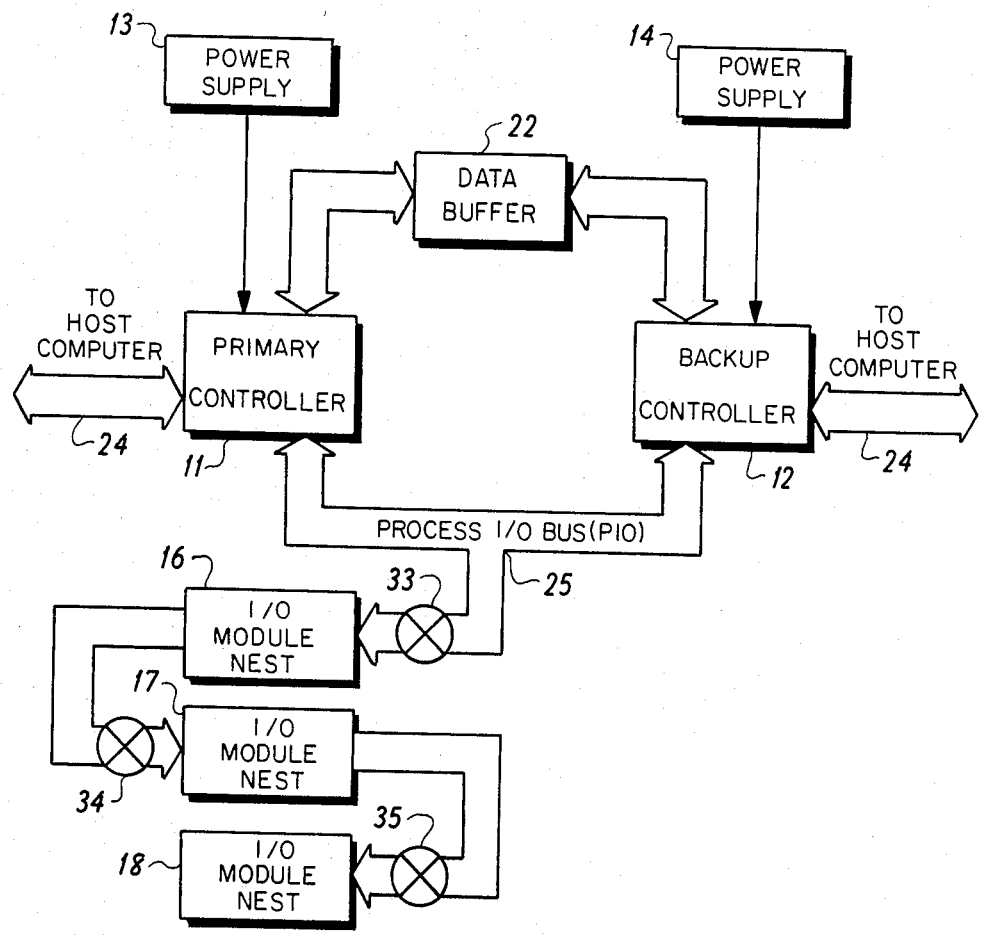
FIG. 2 is a system block diagram of the control system of FIG. 1.

The architecture of the control system is more clearly depicted in FIG. 2 which is similar to and which functions generally as that system disclosed in the aforementioned co-pending application Ser. No. 139,495 now U.S. Pat. No. 4,351,023. The control portion of the system includes a primary controller 11 and a backup controller 12, each communicating with a shared data buffer 22. Details of the transfer of control from the primary to the backup through the data buffer do not form part of the present invention, but if further details are desired, reference may be had to the aforementioned patent application. Each controller contains a central processing unit (CPU), associated read only and random access memory, together with the necessary interfaces to a process I/O (PIO) bus 25. Additionally, each controller includes a security logic module 15 (FIG. 1) and a communications port for communicating over a process data link 24 to a host computer (not shown). When operating in a redundant mode, each controller shares access to the PIO bus from the standpoint of being able to read process data inputted through the I/O nests. This permits the backup controller 12 to track the control over the process. However, the primary controller 11 actually runs the process and it alone is able to output values to the various field-located actuators through commands to the modules within the nests.

The three I/O nests 16, 17 and 18 located in the bottom half of the rack 20 are each capable of accepting ten I/O modules. These I/O modules are printed circuit (PC) boards (collectively represented in FIG. 1 by reference numeral 19) of various types that serve as the primary communication device between the controllers 11, 12 and the field-located sensors and actuators. Both analog and digital input/output signals as well as pulsed outputs (i.e., field signals) are processed through the front termination molding 19A of each PC board. Bidirectional communication between the controllers and the individual PC boards within the I/O nests is through the PIO bus 25 which interweaves in daisy chain fashion through each nest.

Figure 5:
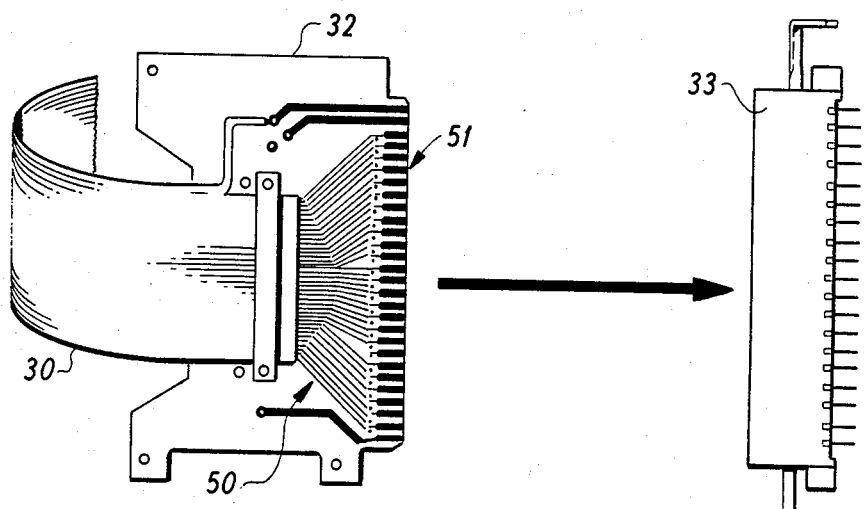
FIG. 5 is a detailed view of the bus interface module and its corresponding connector of the system of FIG. 1.
Figure 4:
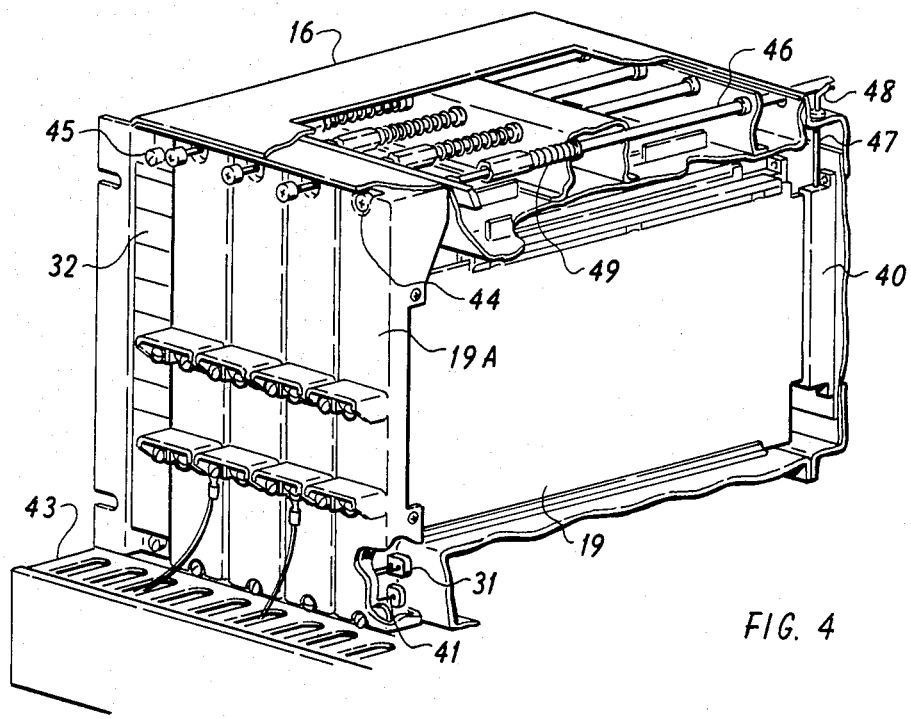
FIGS. 3 & 4 are perspective views of an I/O module nest of the control system of FIG. 1 cut away to show details of the interconnectivity with the process I/O data bus.
Figure 3:
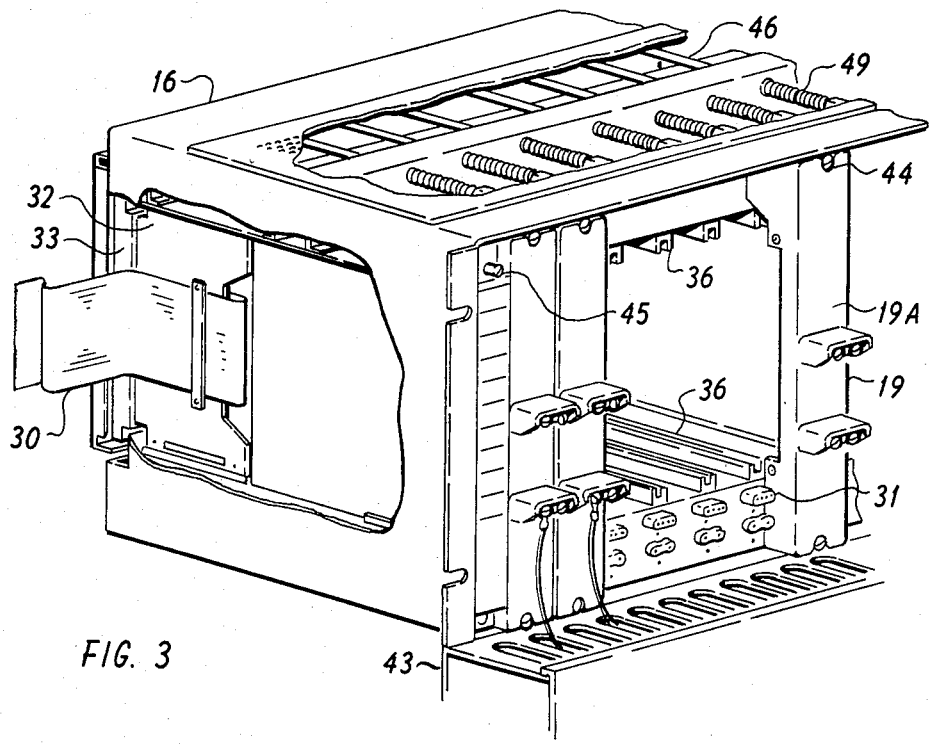

FIG. 3 provides further details of the structure of the I/O nest 16. Bus connection between the controllers 11, 12 and the nest 16 (as well as interconnection between individual nests) is through a multi-channel ribbon cable 30 which terminates in a bus interface module 32. This module (see also FIG. 5 for further detail) is a component-less PC board having a pattern of conductor runs 50 that connect with each of the bus lines in the cable 30 and extend them to a set of contact pads 51 at the edge of the board. The module is inserted at the bus input side of the nest (left-hand end as viewed in FIG. 4) into a cam actuated connector 33 that electrically connects with a conventional bus backplane (not shown) mapped onto the rear of the nest. Thus the connector 33 and the bus interface module 32 serve as both a termination point for the ribbon cable portion of the bus and an interface with the bus backplane. Disconnecting the connector 33 disengages all three nests, and hence all I/O modules, from the PIO bus. Similar cable terminations are provided for bus communication with the other two nests, and the other bus interface module connector breakpoints are symbolically depicted on FIG. 2 as numerals 34 and 35. Thus disconnecting connector 34 disengages all the I/O modules in the nests 17 and 18 from the PIO bus, while disconnecting connector 35 disengages just nest 18 from the bus.

Included as part of the top and bottom frame of the nest 16 is a series of rearwardly extending groved slide tracks 36 for guiding and holding the PC boards 19 in proper position within the nest. Each PC board is powered from two separate connectors. Logic power is supplied from the bus backplane through a cam actuated connector 40 (similar to the connector 33) located at the rear of the slide track adjacent each individual PC board. Concurrently, field signal power is delivered at the front end of the PC board by a power connector 31. When operatively coupled within the nest, the contact pads (not shown) of the PC board are engaged by the connector 40, while a connector plug 41 on the board mates with the power connector 31. As shown more clearly in FIG. 4, wire terminations from the field connections are brought through a wireway 43 at the bottom of the nest to the front termination molding 19A of the PC board. Thus bus access is at the opposite end of the PC board from that of field signal termination.

Turning now to further operational details of the present process control system that permit rapid isolation of bus related faults, the multi-channel, parallel-wired PIO bus 25 includes A/D timing lines, data and identification code lines, control lines and address lines, all of which are necessary for accessing (i.e., reading and writing) information to and from individual PC boards 19. Each controller 11, 12 has its own internal fault monitoring capabilities, which can, for example, involve use of threshold detectors for monitoring power supplies, or utilization of watchdog timers to provide a check on software operations, or parity error detection, all of which is well understood by those of skill in the art. However, failures involving the PIO bus 25 and its interface circuitry, especially such failures which tend to keep the bus active (i.e., in a low state by shorting the bus to ground) or which short bus lines together, are difficult to isolate.

On-line, self-diagnostic testing is continuously run as part of the main system operating program to verify the integrity of the bus lines and their connection to the individual PC boards 19. A series of diagnostic registers that enable software checking of the PIO bus 25 are contained in the security logic module 15 located in each controller. In operation, each diagnostic program is run independently by both the primary controller 11 and the backup controller 12. Whenever a bus-related fault is detected for two successive operating control cycles, a fault-indication light 15A is lit on the security logic module. If the lights on both security logic modules are lit, then the fault most likely lies within the PIO bus network. If only one light is on, the fault is probably within the individual diagnostic registers (or their interface to the PIO bus) on the security logic module of that controller showing the failure indication. As stated, these software self-checks are run on-line each control cycle to assure immediate detection of failures.

Figure 6B:
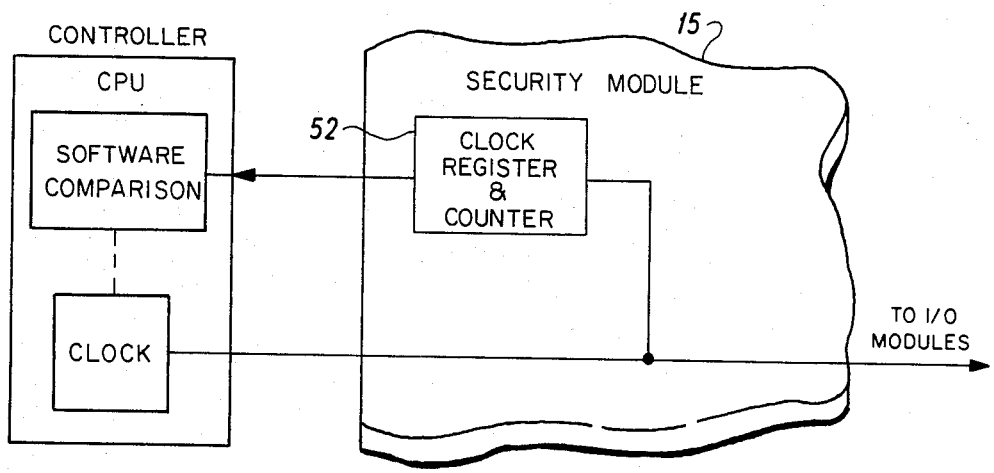
Figure 6C:
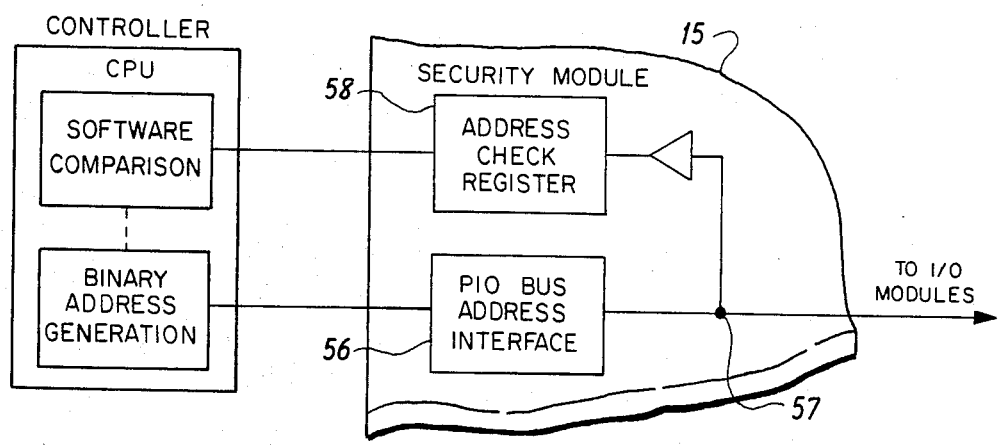

FIGS. 6A through 6C show the hardware/software implementation of the principal diagnostic routines for performing fault monitoring of the PIO bus network.

FIG. 6A illustrates how bus data lines are monitored in conjunction with a data register 54. Each controller generates a distinct sample data pattern which consists of enabling only the most significant bit of the data word, and enabling in succeeding cycles the next bit position until each bit of the entire word has been exercised. This pattern is written onto the PIO bus 25 and read back at the CPU. Because the CPU expects to see this "walking bit" in fixed sequence after its generation, shorted failures within the data lines as well as adjacent lines shorted together will be detected resulting in an appropriate failure indication being displayed.

During a process read phase, analog-to-digital (A/D) conversion is carried out between fixed time intervals as determined by a clock signal generated in each controller's CPU. In between these conversion pulses, a fixed number of clock pulses is delivered to the I/O modules to provide the source of integration for the A/D conversion. A clock register and counter circuit 52 shown in FIG. 6B accumulates the total number of pulses between the beginning and end of conversion pulses, and the contents of this register are read by the CPU during each control cycle. Should the number of pulses detected vary from the fixed number anticipated (whose value is stored in memory), a fault indication will be determined and displayed by the light 15A on both security logic modules 15.

FIG. 6C shows another form of diagnostic check for detecting address line failures. In this instance, the address generated within the CPU of the controller is transmitted through an address interface 56 to the PIO bus 25. The address state generated on the bus is sensed at checkpoint 57 and sent to an address check register 58 for storage and ultimate transmission to the CPU. A comparison is made under program control of the contents of the register 58 with the address generated. Any deviation will produce an alarm indication via the light 15A.

The foregoing description of the types of diagnostic routines is not exhaustive. However, such fault monitoring techniques are representative of the more important areas within the bus network where failures are likely to cause catastrophic system failures.

Assuming the fault-indication light 15A is lit on the security logic module 15 of both controllers 11, 12, fault isolation is initiated by disconnecting the connector 33 of the bus interface module 32. As mentioned, this connector is a cam actuated connector and is mechanically operated by releasing a quarter-turn fastener 45 located on the top front face of the bus interface module. Details of the actuation of this connector will be deferred until operation of the cam actuated connector 40 is discussed presently. Suffice it to say for now that the connector 33 may be quickly disengaged, thereby disconnecting all I/O madules in the three nests 16, 17, and 18 from the PIO bus 25.

If after disengaging the connector 33 the fault-indication lights 15A remain on (remembering that the diagnostic checks are being continuously run), the failure will have been isolated between the I/O nests and the controllers, and specifically to the bus interconnection between the connector 33 and one of the diagnostic registers 52, 54, 58 within the controllers. It will be recalled that in the redundant mode of operation, such a failure indication could also be surmised if only one of the lights 15A were lit. However, since the present invention is also suitably adapted to function with non-redundant systems, this initial quick disconnect procedure will generally apply and is a good starting point for fault isolation.

If, on the other hand, the lights 15A turn off, the failure is in the bus connections beyond the connector 33 to the nests 16, 17, 18. Therefore, connector 33 is reconnected, and the connector 34 may be readily disengaged to gate off the nests 17 and 18 from the PIO bus 25. If the fault indication remains, the fault will have been isolated to one of the PC boards 19 in the nest 16; if not, the fault is in nests 17 and 18. Carrying the above procedure one step further it is possible to isolate the fault to a particular nest.

Once the failed nest has been found, the failure may be in any one of the ten I/O PC boards 19 assigned to that nest. The most prudent way of troubleshooting at this stage is to sequentially disengage each PC board from the bus backplane. In accordance with the present invention this fault isolation procedure is readily and rapidly accomplished without having to physically move the PC board, and importantly without having to disconnect the PC board from its field power connection. This is expeditious because a plurality of field connections are typically brought into a nest, and routing field signal cables to the termination molding 19A and to various other locations within the rack 20 through wireways such as 43 can be cumbersome to the extent of inhibiting the outward mobility of the PC boards from the nest unless the field cables are unscrewed from their termination moldings.

Returning once again to FIGS. 3 and 4, the connection of individual I/O PC boards 19 to the PIO bus 25 is broken by use of the cam actuated connector 40. The connector is remotely actuated from the front of the rack 20 by means of an actuating rod 46 brought out to the front termination molding 19A of the PC board. The actuating rod is connected to a vertical shaft 47 that extends down through the connector 40 at a bent portion 48 thereof. A spring 49 kept in compression by a quarter-turn fastener 44 on the front termination molding 19A holds the connector in contact with the PC board connector pads. Unlocking the fastener a quarter-turn releases the actuating rod by relaxing the spring 49 which in turn produces rotary movement of the vertical shaft 47. The vertical shaft rotates a cam (not shown) within the connector thereby moving the connector contacts away from the PC board contact pads so as to disengage the PC board from the PIO bus 25.

Rotary cam actuated connectors of this general type are commercially available from AMP, Incorporated. Reconnection to the bus is simply accomplished by locking the quarter-turn fastener 44. When the failed PC board is disengaged from the bus, the diagnostic routines will discover that the failure has been removed from the system and correspondingly the fault isolation lights 15A will be turned off.

Because fault isolation is being performed on-line, removal and replacement of I/O modules (PC boards) can occur at random times within the system operating cycle—for example, during a "write" phase to the PIO bus. Furthermore, maintenance procedures of this type often can result in shorting bus lines together due to the manner in which the board is removed or inserted, i.e., by cocking the board. This would disrupt operation of the bus and could itself be a source of significant error for the control system. Although chances of inadvertent shorts are minimized in the present embodiment as the PC board is not moved to break the bus connection, the operation of certain components can be adversely affected depending, for example, on the sequence by which they are powered/unpowered. To avoid any such difficulties the break of the PC board from the PIO bus is achieved in a two-step sequence. The cam within the connector 40 is designed to allow two sets of contacts to open/close as the cam is progressively rotated from either the connector actuated or disengaged positions. The placement of signal conductor runs to the PC board pads is coordinated with this two-stage contact opening/closing of the connector 40 in a manner that avoids transferring erroneous data during this connect/disconnect cycle of the fault isolation procedure. For the embodiment being described, data lines and logic power are disconnected first, followed by the disconnection of control lines and logic common. Of course, when a board is reinserted, the reverse is accomplished.

The connect/disconnect fault isolation feature can influence system operation by disrupting the values of field signals. It is particularly important that the integrity of output values be maintained during a fault isolation procedure; otherwise the process valve could be driven uncontrollably between its open and closed states thereby causing a process upset. FIG. 7, which pictorially gives the outline of a PC board 19, illustrates how field values are preserved. As mentioned, field power is maintained on the PC board during a fault isolation check as connector 41 remains engaged. Meanwhile logic power is interrupted by breaking the connection with the PIO bus 25 when the cam actuated connector 40 is disconnected. The provisions of separate connections for both logic and field power together with in situ disengagement of the PC board from the bus permit the value of the analog field signal to be maintained.

In this example, the PC board 19 represents an output channel for providing an analog signal to a valve as directed by the primary controller 11. An output command loads the digital value present on the bus 25 in a 12-bit output register 62 after passing through a bus and register interface circuit 60. Thereafter, digital-to-analog conversion is performed by a D/A converter circuit 64 and the resultant analog signal is delivered through the field termination block 19A by a suitable output drive circuit 66. As shown, the bus and register interface circuit 60 is driven in part from the logic power supply, while the 12-bit output register 62 obtains its operating power from the field power connector 41 located at the front of the PC board.

In order to update the register 62, three signals must be low at gate 70. First, a write command must be initiated by the primary controller 11 and sent to a control logic circuit 72 on the PC board for routing to the gate. A low signal level must be received from a presence of card detector circuit 74 (which can simply include a path for drawing current through the logic common connection) and a low signal from a logic power voltage monitor 76 must also be present. Obviously, when the PC board is disconnected from the PIO bus 25 both the presence of card detector and the logic power voltage monitor signals are missing; therefore, the register cannot be updated with a new digital value. Since, however, the register is powered from the field connector 41, the prior digital output value remains stored in the register and hence the valve will be maintained at the last position before the fault isolation procedure on that card was initiated. In the foregoing example, emphasis was placed on preserving the state of output signals to field devices, but the principles illustrated apply equally as well to other field signals.

Although a preferred embodiment has been set forth in detail above, this is only for the purpose of illustration as modifications will become apparent to those of ordinary skill in the art. Accordingly the invention is not to be limited by its illustrated embodiments but only in accordance with the scope of the accompanying claims.

We claim:

1. In a control system for providing direct digital control over an industrial process of the type having a digital controller communicating with a plurality of sensors and actuators located within a process field area, said controller including in a first location a central processing unit and associated data storage means for performing operations respecting the condition of said process and in a second location an input/output connector housing area for holding a plurality of input/output modules that receive and send field signals to and from said sensors and actuators, said controller further including a communications bus linking said first and second locations such that said input/output modules are connected in parallel along said bus when inserted in said connector housing area, the improvement in said control system for detecting and isolating failures within said controller comprising:

means for detecting a fault condition within said controller;

means responsive to said detector means for providing an indication of said fault condition;

means for isolating said fault condition between either said first location or said second location;

said means for isolating including means for rapidly disconnecting said input/output modules from said first location, whereby the absence or continuance of said fault indication pinpoints whether said fault condition is in said first or second location.

2. The system of claim 1 wherein said input/output connector housing area comprises a plurality of connector nests arranged to receive a predetermined number of said input/output modules for communicating over said bus, each of said nests including a bus interface module for disconnecting all the input/output modules contained therein from said bus.

3. The system of claim 2 including a cam actuated connector coupling said bus interface module to said bus.

4. The system of claim 2 including a cam actuated connector coupling said input/output modules to said bus.

5. The system of claim 4 wherein said connector includes at least a two-stage cam to permit sequenced opening/closing of the connector contacts such that the connection/disconnection to said bus during on-line maintenance is accomplished in accordance with a pre-established sequence to avoid transfer of erroneous data during this connect/disconnect cycle.

6. The system of claim 1 wherein said input/output modules include means for disengaging individual input/output modules from said bus while simultaneously maintaining the value of said field signals.

7. The system of claim 6 wherein said input/output modules comprise a printed circuit board having field interface and digital circuits electrically powered thereon by two separate power connections, one connection for receiving logic power to drive said digital circuits and the other connection for receiving field power to drive said field interface circuits.

8. The system of claim 7 wherein said means for disengaging includes a cam actuated connector coupling said modules to said bus, said logic power being received from said bus.

9. The system of claim 8 including a field power connector remotely positioned from said cam actuated connector for receiving said field power, said cam actuated connector being actuated independently of the connection of said field power connector.

10. The system of claim 9 including a storage register on said module for storing the value of field signals representing the condition of said process, said register being powered from said field power connector such that when said cam actuated connector is disengaged said field signal value is maintained.

11. In a control system for providing direct digital control over an industrial process of the type having a digital controller communicating with a plurality of sensors and actuators located within a process field area, said controller including in a first location a central processing unit and associated data storage means for performing operations respecting the condition of said process and in a second location an input/output connector housing area for holding a plurality of input/output modules that receive and send field signals to and from said sensors and actuators, said control system further including a communications bus linking said first and second locations such that said input/output modules are connected along said data bus when inserted in said connector housing area, said modules being powered from said bus connection and a separate field connection for providing field power to said sensors and actuators, the improvement in said control system comprising:
means for disengaging said input/output modules from said bus while simultaneously maintaining said field connection.

12. The system of claim 11 wherein said means for disengaging includes a cam actuated connector.

13. The system of claim 12 wherein said cam actuated connector is actuated independently of said field connection.

14. The system of claim 12 including means for storing field signal values on said input/output modules, said storing means being powered from said field connection such that when said cam actuated connector is disengaged said field signal values are maintained.

15. The system of claim 11 including means for disconnecting said input/output modules from said bus in situ.

16. The system of claim 15 wherein said disconnecting means includes a cam actuated connector coupling said modules to said bus.

17. In a control system for providing direct digital control over an industrial process of the type having a digital controller communicating with a plurality of sensors and actuators located within a process field area, said controller including in a first location a central processing unit and associated data storage means for performing operations respecting the condition of said process and in a second location an input/output connector housing area for holding a plurality of input/output modules that receive and send field signals to and from said sensors and actuators, said controller further including a communications bus and associated cable means electrically linking said first and second locations such that said input/output modules are connected to said bus when inserted in said connector housing area, said controller also receiving at said modules field signal cables for communicating with said process field area, the improvement in said control system for detecting and isolating failures within said controller comprising:
means for disconnecting said input/output modules from said bus in situ within said connector housing area without altering the position of either said cable means or said field signal cables.

18. The system of claim 17 wherein said disconnecting means includes a cam actuated connector coupling said modules to said bus.

19. The system of claim 17 including means for maintaining field signal values when said input/output modules are disconnected from said bus.

20. An improved method for detecting and isolating failures within a direct digital control system of the type having a digital controller communicating with a plurality of sensors and actuators located within a process field area, said controller including in a first location a central processing unit and associated data storage means for performing operations respecting the condition of said process and in a second location an input/output connector housing area for holding a plurality of input/output modules that receive and send field signals to and from said sensors and actuators, said controller further including a communications bus linking said first and second locations such that said input/output modules are connected in parallel along said bus when inserted in said connector housing area, comprising the steps of:
detecting a fault condition within said controller;
providing an indication of said fault condition;
isolating said fault condition between either said first location or said second location by rapidly disconnecting said input/output modules from said first location.

21. The method of claim 20 including the further step of isolating faults within said second location by sequentially disconnecting individual input/output modules without moving said modules within said connector housing area.

22. The method of claim 21 including the further step of maintaining the value of said field signals when said input/output modules are disconnected from said bus.

23. The method of claim 21 wherein said sequential disconnection is accomplished by a cam actuated connector.

24. The method of claim 23 including the step of actuating a two-stage cam within said connector to permit sequenced opening/closing of the connector contacts such that the connection/disconnection to said bus during on-line maintenance is accomplished in accordance with a pre-established sequence to avoid transfer of erroneous data during this connect/disconnect cycle.

* * * * *